(12) United States Patent
Aspir et al.

(10) Patent No.: US 6,795,186 B2
(45) Date of Patent: Sep. 21, 2004

(54) ADAPTIVE TOLERANCE REFERENCE INSPECTION SYSTEM

(75) Inventors: Doron Aspir, Modi'in (IL); Menahem Kraus, Bnei Brak (IL); Dror Orgad, Yehud (IL); Jacob Nadivi, Ashdod (IL)

(73) Assignee: Orbotech Ltd., Yavne (IL)

( * ) Notice: Subject to any disclaimer, the term of this patent is extended or adjusted under 35 U.S.C. 154(b) by 0 days.

(21) Appl. No.: 10/148,734

(22) PCT Filed: Dec. 5, 2000

(86) PCT No.: PCT/IL00/00820

§ 371 (c)(1), (2), (4) Date: May 31, 2002

(87) PCT Pub. No.: WO01/40770

PCT Pub. Date: Jun. 7, 2001

(65) Prior Publication Data

US 2002/0180468 A1 Dec. 5, 2002

(30) Foreign Application Priority Data

Dec. 5, 1999 (IL) ............................................. 133313

(51) Int. Cl.$^7$ ............................................. G01B 11/00
(52) U.S. Cl. ..................................................... 356/394
(58) Field of Search ................................ 356/388, 392, 356/394, 397, 398; 382/145–152

(56) References Cited

U.S. PATENT DOCUMENTS

| | | | |
|---|---|---|---|
| 4,185,298 A | * 1/1980 | Billet et al. ................. | 348/129 |
| 4,481,664 A | 11/1984 | Linger et al. ................. | 382/8 |
| 4,648,053 A | 3/1987 | Fridge ........................ | 364/551 |
| 4,830,497 A | 5/1989 | Iwata et al. ................. | 356/394 |
| 4,893,346 A | 1/1990 | Bishop ........................ | 382/8 |
| 5,495,535 A | 2/1996 | Smilansky et al. ......... | 382/145 |

FOREIGN PATENT DOCUMENTS

| | | |
|---|---|---|
| TW | 139547 | 8/1990 |
| WO | WO 01/48465 | 7/2001 |

* cited by examiner

Primary Examiner—Michael P. Stafira
(74) Attorney, Agent, or Firm—Ladas & Parry

(57) ABSTRACT

Method and apparatus for automatically optically inspecting electrical circuits by matching portions of an electrical circuit being inspected to corresponding portions in a reference, wherein an adaptive spatial tolerance representing a permissible deviation in the location of corresponding portions is applied to a portion. The spatial tolerances for each portion is in part a function of a characteristic of the portion, for example one or more of: the proximity of the portion to other portions of predetermined type, a spatial location of the portion in an electrical circuit, a material from which the portion is formed, the color of the portion and the intensity of light reflected by the portion. Non-defective matching portions an electrical circuit being inspected and in a reference must be separated by a distance which is less than the adaptive spatial tolerance.

62 Claims, 10 Drawing Sheets

ADAPTIVE TOLERANCE REFERENCE INSPECTION SYSTEM

This application is a 371 of PCT/IL00/00820 filed Dec. 5, 2000.

FIELD OF THE INVENTION

The present invention generally relates to automated optical inspection systems, and more particularly to references used in the automated optical inspection of electrical circuits.

BACKGROUND OF THE INVENTION

Electrical circuits, such as electrical circuits found on printed circuit boards, ball grid array substrates, semiconductors and other similar electrical circuits, typically are inspected during various stages of their manufacture using automated optical inspection apparatus. Automated optical inspection ("AOI") conventionally is performed for one or more of the following reasons: to ensure that various elements, referred to herein as features and described hereinbelow in greater detail, that should be in an electrical circuit according to a design do indeed exist in the electrical circuit being inspected; to ensure, that the features are appropriately placed and appropriately shaped; and to ensure that undesired features are not present.

It is well known to inspect electrical circuits for the existence and placement of features by identifying features in an electrical circuit being inspected according to their morphology, determining the location of each such feature, and then matching each feature in the electrical circuit to a corresponding feature in a reference. References may be generated from a "golden" electrical circuit which is an electrical circuit that is known to be good or alternatively from computer generated data such as computer aided design ("CAD") data or computer aided manufacturing ("CAM") data. Additionally, neighboring identical regions in an electrical circuit may be used as mutual references.

In conventional automated optical inspection systems, a global tolerance is applied to all features, or to all features of a particular morphological type. As used herein the term "tolerance" refers to a distance by which the respective locations of corresponding matching portions, such as matching features, in an inspection input and in a reference input may deviate from each other without the feature in the inspection input being considered defective. Thus, a feature in an electrical circuit being inspected does not have be located at the exact location as indicated by the corresponding matching feature in a reference. Rather the location of a feature in an electrical circuit being inspected may deviate from an exact location indicated by its corresponding matching feature in the reference within the limits of the tolerance. A conventional AOI system that applies a tolerance dictated by feature morphology is an Inspire™ 9000 AOI system available from Orbotech Ltd. of Yavne, Israel.

In some modern electrical circuit designs not all features require the same tolerance in the sense that some features require greater precision in location than other features, even for features of the same morphological type. Degrees of precision which determine a tolerance are typically provided as part of an electrical circuit design or are input by a user. The use of a global tolerance applying to all features, or a feature morphology dictated tolerance applying to all features of the same morphological type, in an electrical circuit being inspected generally leads to an undesirably large quantity of "false alarm" defects if the tolerance is set to be too low, or to an undesirably large quantity of undetected defects if the tolerance is set to be too high.

SUMMARY OF THE INVENTION

The present invention seeks to provide an improved system and method for inspecting electrical circuits for defects.

The present invention further seeks to provide an improved method for preparing a reference for use in inspecting electrical circuits.

A general aspect of a preferred embodiment of the present invention relates to a system for automatically optically inspecting electrical circuits by matching portions of an electrical circuit being inspected to corresponding portions in a reference, wherein various tolerances are provided for the portions as a function of a characteristic thereof. Preferably, the characteristic is one or more of a spatial characteristic, an optical characteristic or a suspected shape aberration. The spatial characteristic preferably is one or more of separation between two portions, a spatial location in the electrical circuit, a density of features in an electrical circuit. The optical characteristic preferably is one or more of a color, an optical characteristic associated with a material from which a feature is formed, or a level of reflectivity associated with a feature. The characteristic may be any one single characteristic, any combination of the preceding characteristics, or any combination of the preceding characteristics in further combination with a morphological characteristic of a feature.

Another aspect of a preferred embodiment of the present invention relates to a method for generating a reference to be used in the automated optical inspection of electrical circuits. Preferably the reference includes various tolerances that are applied to features in the electrical circuit as a function of a spatial characteristic, an optical characteristic, a shape aberration, any combination of the preceding characteristics, or any combination of the preceding characteristics in further combination with a morphological type associated with a feature.

Still another aspect of the present invention relates to a method for applying adaptive tolerances to references employed in the automated optical inspection of electrical circuits. An image to be used as a reference during automated optical inspection is analyzed, preferably by computer, to identify various spatial or optical characteristics of features therein. Features are classified by their characteristic, marked and saved as a reference. Prior to automatically optically inspecting an electrical circuit, tolerances are provided independently of the classification applying to features. An inspection reference is generated by merging the reference and the tolerances and by applying the tolerances as function of the characteristics.

There is thus provided in accordance with a preferred embodiment of the present invention a system for inspecting electrical circuits comprising a proximity indicator for indicating the proximity of at least a first portion of an electrical circuit to at least a second portion of an electrical circuit; circuitry, responsive to an output of said proximity indicator, for providing a tolerance output based on the proximity of said at least a first portion of an electrical circuit to said at least a second portion of an electrical circuit; and fault detection circuitry operative in response to inspection inputs representing an electrical circuit being inspected to provide an output indication of faults in said electrical circuit being inspected based at least in part on said tolerance output.

Preferably, the first portion and the second portion are in a representation of an electrical circuit of the same type as said electrical circuit being inspected. Generally, the first portion and said second portion are features in the electrical circuit, typically an open end, a pad, or a junction.

Further in accordance with a preferred embodiment of the present invention, the proximity indicator is operative to indicate the proximity between two features having a same morphological type. Alternatively, the proximity indicator is operative to indicate the proximity between two features having a different morphological type.

Additionally, in accordance with a preferred embodiment of the present invention, the tolerance is a permitted spatial separation between a feature of a reference electrical circuit and a corresponding feature of an electrical circuit being inspected.

Moreover, in accordance with a preferred embodiment of the present invention, a feature is classified as being isolated or non-isolated with reference to a spatial separation threshold between neighboring features, and the tolerance for a feature that is classified as isolated is greater than the tolerance for a first portion that is non-isolated.

Preferably, the tolerance for an isolated feature of a first morphological type is different than the tolerance for an isolated feature of a second morphological type. Alternatively, the tolerance for a non-isolated feature of a first morphological type is different than the tolerance for a non-isolated feature of a second morphological type.

Further in accordance with a preferred embodiment of the present invention, the tolerance for an isolated feature in a defined spatial region is different than the tolerance for an isolated feature outside the defined spatial region. Additionally, the tolerance for a non-isolated feature in a defined spatial region is different than the tolerance for a non-isolated feature outside the defined spatial region.

Still further in accordance with a preferred embodiment of the present invention, the tolerance for an isolated feature having a predetermined color is different than the tolerance for an isolated feature having a color other than the predetermined color. Additionally, the tolerance for a non-isolated feature having a predetermined color is different than the tolerance for a non-isolated feature having a color other than the predetermined color.

Still further in accordance with a preferred embodiment of the present invention, the tolerance for an isolated feature formed of a predetermined material is different than the tolerance for an isolated feature formed of a material other than the predetermined material. Additionally, the tolerance for a non-isolated feature formed of a predetermined material is different than the tolerance for a non-isolated feature formed of a material other than the predetermined material.

Furthermore, in accordance with a preferred embodiment of the present invention, a feature in an electrical circuit being inspected is not defective if it is separated from the location of a matching feature in the reference electrical circuit by less than the tolerance applying to an isolated feature. Additionally, a feature in an electrical circuit being inspected is not defective if the location of the feature in the electrical circuit being inspected is separated from the location of a corresponding feature in the reference electrical circuit by greater than the tolerance for a non-isolated feature, and less than the tolerance for an isolated feature, and the feature is isolated.

There is provided in accordance with another preferred embodiment of the present invention a system for inspecting electrical circuits comprising a tolerance indicator for providing a tolerance output based on at least one spatial characteristic of an electrical circuit; and fault detection circuitry operative in response to inspection inputs representing an electrical circuit being inspected to provide an output indication of faults in said electrical circuit being inspected based at least in part on the tolerance output.

In accordance with a preferred embodiment of the present invention, the spatial characteristic is a spatial characteristic in a reference electrical circuit of the same type as the electrical circuit being inspected. Additionally and alternatively, the spatial characteristic is a spatial location in the electrical circuit being inspected.

Further in accordance with a preferred embodiment of the present invention, the spatial characteristic is the separation between the location a first feature and the location of second feature. Preferably, the first feature and the second feature are of the same morphological type. Alternatively, the first feature and the second feature are of different morphological types.

Moreover, in accordance with a preferred embodiment of the present invention, an isolated feature is feature whose location is separated from the location of a another feature by more than a threshold value and a non-isolated feature is a feature whose location is separated from the location of another feature by less than a threshold value. Preferably a the threshold is provided as a user input.

Further in accordance with preferred embodiment of the present invention the tolerance provided for an isolated feature is greater than the tolerance provided for a non-isolated feature.

Additionally and alternatively in accordance with preferred embodiment of the present invention the spatial characteristic is the presence of the feature in a predefined spatial region in an electrical circuit. Preferably, the tolerance provided for an isolated feature inside the spatial region is different than the tolerance for an isolated feature outside the spatial region. Moreover, the tolerance provided for a non-isolated feature inside the spatial region preferably is different than the tolerance for a non-isolated feature outside the spatial region.

Still further in accordance with a preferred embodiment of the present invention, a feature in the inspection input is not-faulty if the separation between the location of the feature and the location of a corresponding feature in a reference for the electrical circuit is less than the tolerance for a non-isolated feature.

Moreover, the feature in said inspection inputs preferably is not-faulty if the separation of the location between the feature and the location of a corresponding feature in a reference for the electrical circuit is less than the tolerance for an isolated feature, and the feature is an isolated feature.

Alternatively, in accordance with a preferred embodiment of the present invention, the spatial characteristic is a density of features in the electrical circuit at least in a portion of the electrical circuit in the spatial vicinity of the feature.

There is thus provided in accordance with another preferred embodiment of the present invention system for inspecting electrical circuits comprising a tolerance indicator for providing a tolerance output based on at least one optical characteristic of a portion of an electrical circuit; and fault detection circuitry operative in response to inspection inputs representing an electrical circuit being inspected to provide an output indication of faults in said electrical circuit being inspected based at least in part on said tolerance output.

In accordance with a preferred embodiment of the present invention the optical characteristic is an optical characteristic in a reference electrical circuit of the same type as the electrical circuit being inspected. Alternatively, the optical characteristic is an optical characteristic in the electrical circuit being inspected.

Further in accordance with a preferred embodiment of the present invention, the tolerance output is assigned to a feature according to its according to its optical characteristic.

Still further in accordance with a preferred embodiment of the present invention, the optical characteristic the color of the feature. Alternatively, the optical characteristic is a function of a material from which the feature is formed. Still alternatively, the optical characteristic is the intensity of light reflected by the feature.

Further in accordance with a preferred embodiment of the present invention, a tolerance output is assigned to a portion of an electrical circuit based on the combination of one or more optical characteristics and one or more spatial characteristics associated with the portion.

There is thus provided in accordance with another preferred embodiment of the present invention a method for preparing a reference for use in inspecting electrical circuits, comprising the steps of receiving a representation of an electrical circuit to be inspected; analyzing the representation to classify a portion of the representation according to a spatial characteristic; and assigning a tolerance to the portion as a function of the spatial characteristic.

In accordance with a preferred embodiment of the present invention, the representation received is from CAM data for the electrical circuit. Alternatively, the representation received is from CAD data for the electrical circuit. Still alternatively, the representation is an image for a known good electrical circuit of the same type as the electrical circuit.

Further in accordance with a preferred embodiment of the present invention, the spatial characteristic is a separation between a first portion in the representation and a second portion in the representation. Preferably, each portion is a feature and the spatial characteristic is the spatial location of the feature in the electrical circuit.

Moreover, in accordance with a preferred embodiment of the present invention, a first tolerance is assigned to portions having a first spatial characteristic, and a second tolerance is assigned to portions having a second spatial characteristic different from the first characteristic.

There is thus provided in accordance with another preferred embodiment of the present invention a method for preparing a reference for use in inspecting electrical circuits, comprising the steps of receiving a representation of an electrical circuit to be inspected; analyzing the representation to classify a portion of the representation according to an optical characteristic; and assigning a tolerance to the portion as a function of the optical characteristic.

In accordance with a preferred embodiment of the present invention, the representation received is from CAM data for the electrical circuit. Alternatively, the representation is from CAD data for the electrical circuit. Still alternatively, the representation is an image for a known good electrical circuit of the same type as the electrical circuit.

Further in accordance with a preferred embodiment of the present invention, the portion is a feature in the electrical circuit and the optical characteristic is a color of the feature. Alternatively, the portion is a feature in the electrical circuit and the optical characteristic is the intensity of light reflected by the feature. Still alternatively, the portion is a feature in the electrical circuit and the optical characteristic is an optical characteristic associated with a material from which the feature is formed.

Still further in accordance with the present invention, a first tolerance is assigned to features having a first optical characteristic, and a second tolerance is assigned to portions having a second optical characteristic different from the first optical characteristic.

Additionally and alternatively, the first tolerance is assigned to features having a first optical characteristic and a first spatial characteristic, and a second tolerance is assigned to features have either different optical characteristic or a different spatial characteristic.

BRIEF DESCRIPTION OF THE DRAWINGS

The present invention will be understood and appreciated from the following detailed description, taken in conjunction with the drawings in which.

DETAILED DESCRIPTION OF PREFERRED EMBODIMENTS

Figure 1:
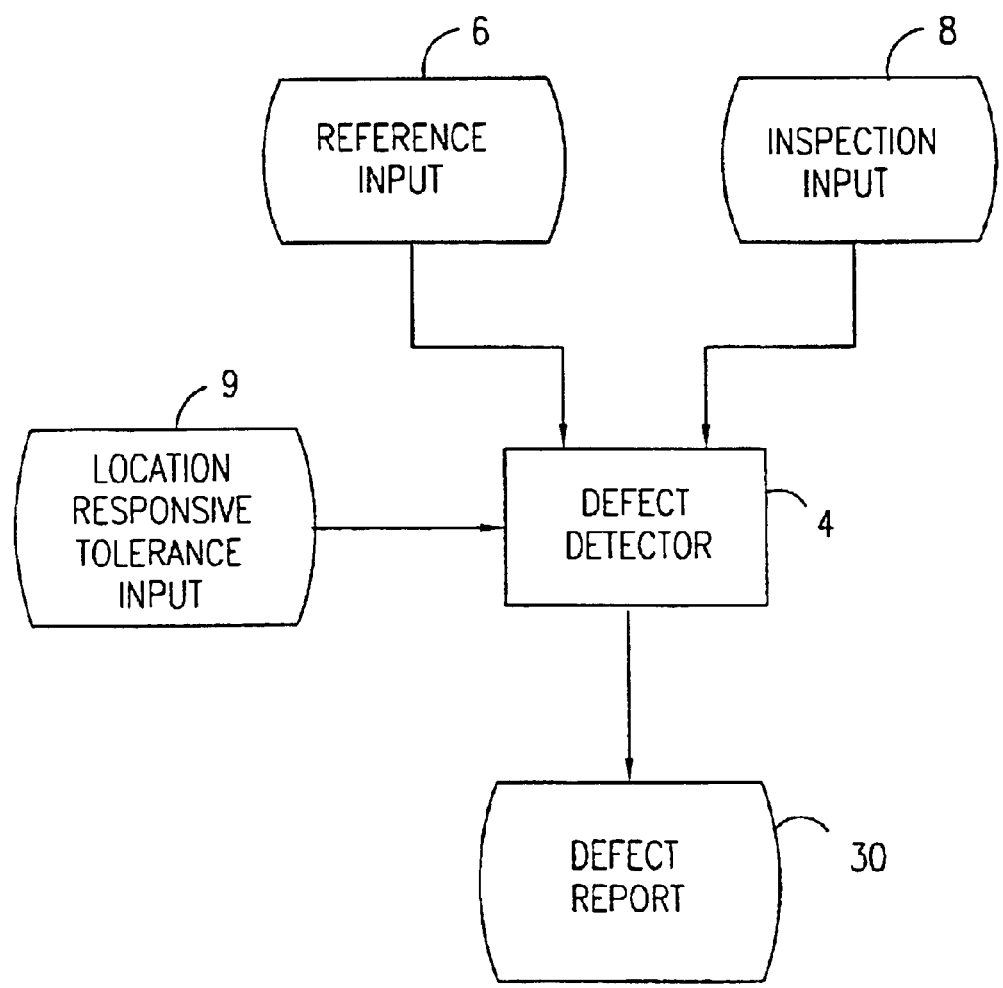
FIG. 1 is a generalized block diagram of a defect detection system for detecting defects in an article to be inspected, constructed and operative in accordance with a preferred embodiment of the present invention.

Reference is now made to FIG. 1 which is a generalized block diagram of a defect detection system 2, for detecting defects in an article to be inspected, constructed and operative in accordance with a preferred embodiment of the present invention. Defect detection system 2 preferably forms part of an AOI system and is particularly suitable for inspecting electrical circuits.

In accordance with a preferred embodiment of the present invention, defect detection system 2 preferably comprises a defect detector 4, which preferably receives as inputs a reference input 6 representing an article which is known to be not defective, an inspection input 8 from an image of an article being inspected, and a location responsive tolerance input 9. Preferably, location responsive tolerance input 9 indicates various tolerances at least some of which are a function of a location parameter relating to reference input 6 and/or inspection input 8. Location responsive tolerance input 9 defines a permissible deviation between corresponding portions of reference input 6 and inspection input 8 for a given location thereon. The location responsive tolerance input 9 thus applies different tolerances to various features of an electrical circuit represented by reference input 6 and inspection input 8. These tolerances may vary in accordance with the location of the features. Alternatively, alone or in combination with location, location responsive tolerances may be a function of one or more of morphology of the feature, size of the feature, color of the feature, the material from which the feature is formed, the average density of features, the shape of the feature, or an intensity value for light reflected off of the feature.

Figure 2:
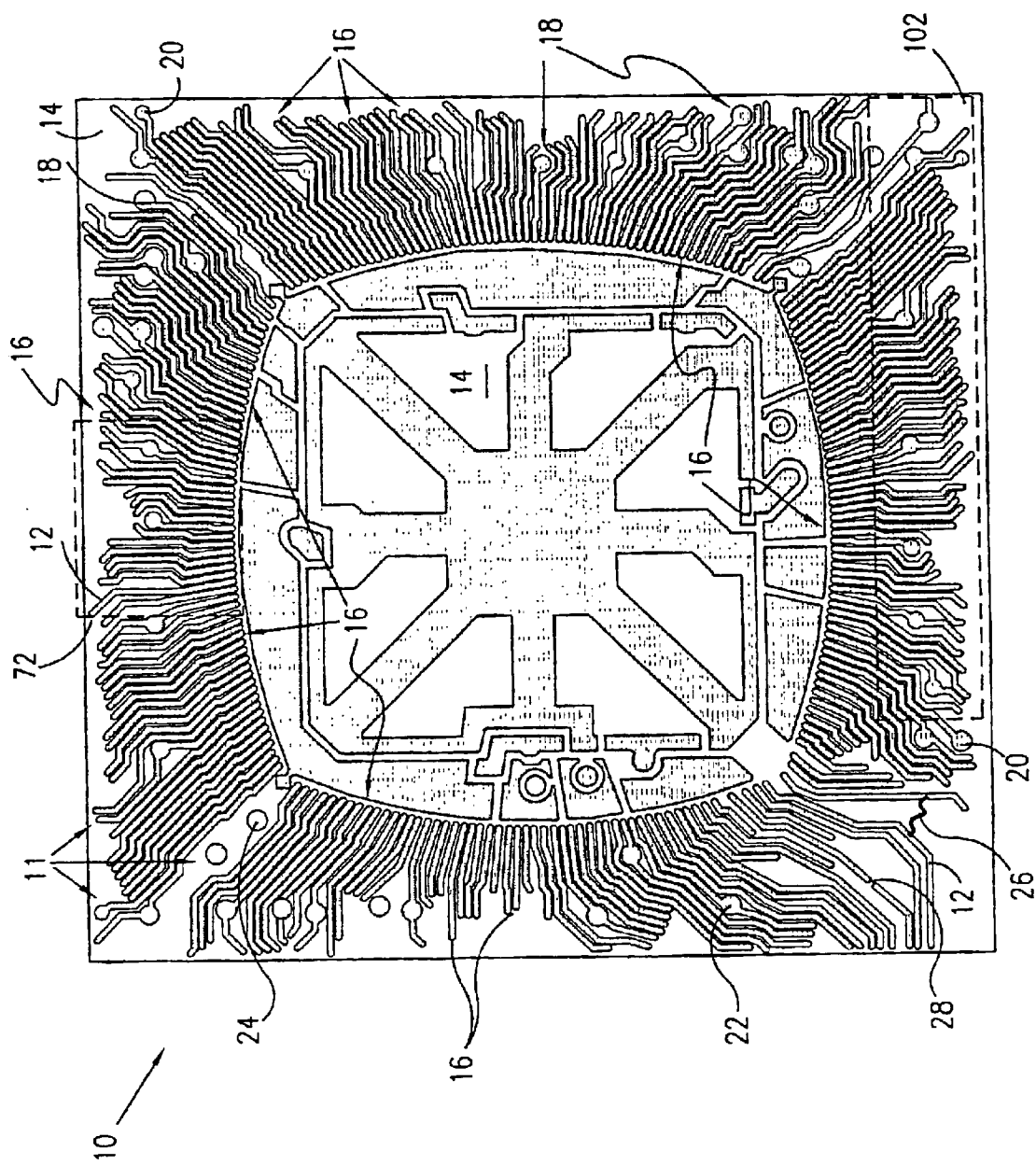
FIG. 2 is a pictorial illustration of an electrical circuit suitable for inspection by an AOI system such as the system shown and described in FIG. 1.

Reference is made to FIG. 2, which is a pictorial illustration of an electrical circuit 10 suitable for inspection by an AOI system such as the system shown and described in FIG. 1 and is illustrative of various morphological types of features 11 typically present in an electrical circuit.

Electrical circuit 10 is seen to comprise a multiplicity of conductors 12 formed of a conductive material such as copper deposited on a substrate 14 formed of a non-conductive material, and includes features 11 of different morphological types. Some conductors 12 have a pair of open ends, indicated by reference numeral 16. Various bonding pads 18 are also seen. These include terminal bonding pads 20, namely bonding pads that are located at an end of a conductor 12, intermediate bonding pads 22, namely bonding pads that are located along an intermediate section of a conductor 12, and island bonding pads 24 which are not connected to any conductor 12.

Electrical circuit 10 may additionally include junctions (not shown) which are the intersection of two or more conductors 12. Typical undesired features shown in FIG. 2 include short circuits 26, where two conductors 12 that should be separated are connected, and breaks 28 where a conductor that should be continuous is broken into separate parts.

Referring back to FIG. 1, it is noted that reference input 6 and inspection input 8 preferably specify various elements and features by morphological type and location. For example, a reference input preferably comprises a list of features 11 (FIG. 2) specifying the morphological type and the desired spatial coordinates of the feature 11. Location responsive tolerance input 9 preferably includes one or more of the following types of tolerances that are a function of a characteristic of the feature either in reference input 6 and/or in inspection input 8: various spatial tolerances including tolerances that are a function of location of the feature 11, tolerances that are a function of the proximity of a feature 11 to other features 11 of the same morphological type, tolerances which are a function of the proximity of a feature 11 to any other features 11 of any morphological type, tolerances that are a function of an average density of features 11 in a spatial region on an electrical circuit; various tolerances that are a function of an optical characteristic of a feature 11 including tolerances that are a function of the material composition of the feature 11, tolerances which are a function of the color of the feature 11; tolerances which are a function of the intensity of light reflected off of the feature 11; tolerances that are a function of the size of feature 11 or a shape aberration in feature 11; and tolerances that are a function of any combination of the foregoing, alone or in combination with a morphological type of the feature.

Preferably, defect detector 4 matches corresponding features in reference input 6 and in inspection input 8 to detect defects in an article being inspected. Typical defects include features that are present in reference input 6 but that are not present in inspection input 8, features that are present in inspection input 8 but that are not present in reference input 6, and features that are present in both reference input 6 and in inspection in put 8, but which are separated from each other by a distance which is greater than the tolerance applied thereto, such as a location responsive tolerance or any other of the tolerances mentioned hereinabove. Defects that are detected by defect detector 4 are reported in a defect report 30.

Operation of defect detector 4 may be better understood by the following example which makes reference to FIG. 2: Assuming that location responsive tolerance input 9 provides that a first location responsive tolerance of 1.5 mils applies to each open end 16 in reference input 6 that is located less than 5 mils away from its closest neighboring open end, and that a second location responsive tolerance of 4 mils applies to each open end 16 that is separated by a distance greater than or equal to 5 mils away from its closest neighboring open end 16. Any pair of corresponding matching open ends 16 in reference input 6 and inspection input 8 respectively that are separated from each other by a distance which is greater that the respective location responsive tolerance applying thereto is reported as defective.

Figure 3:
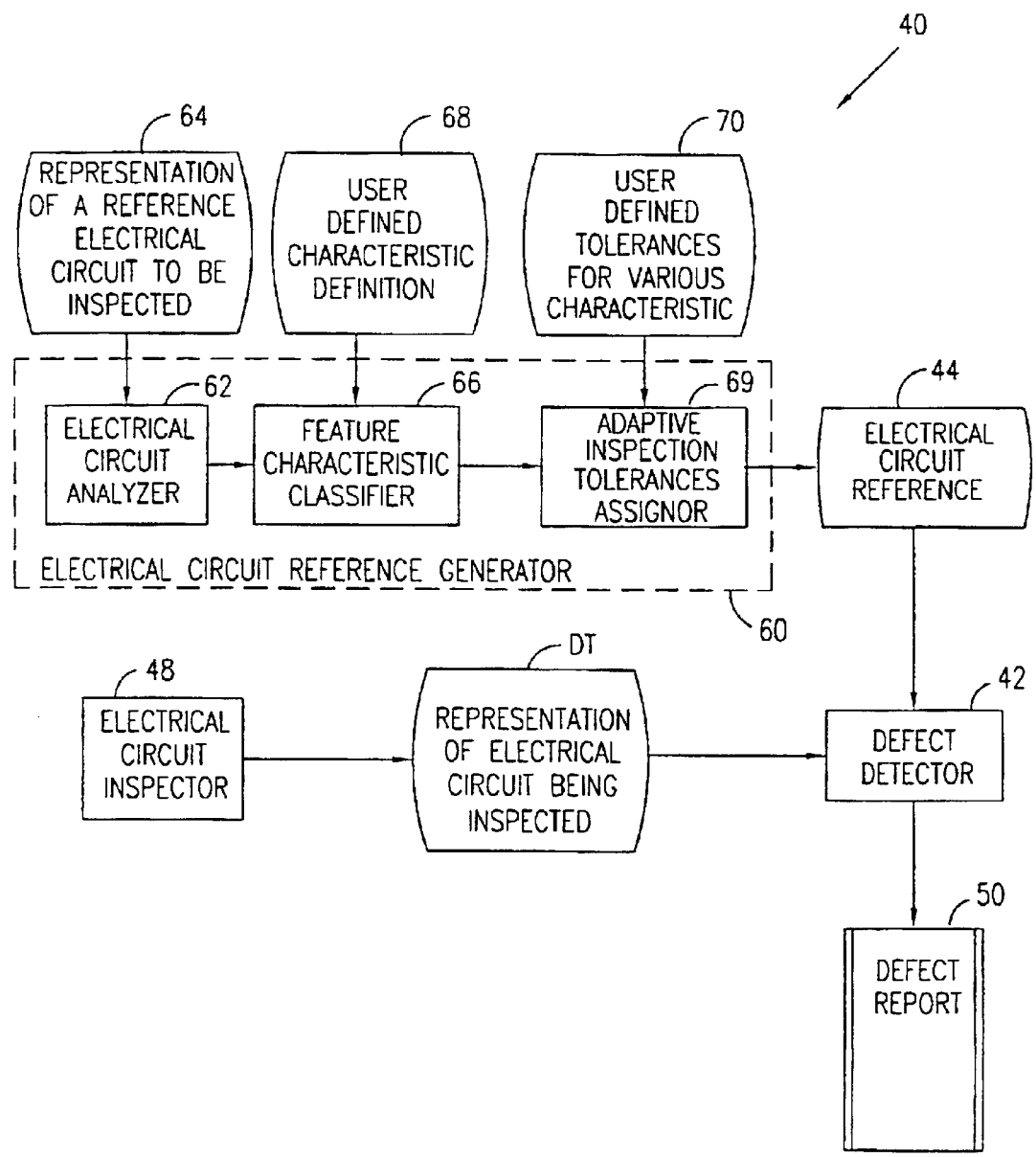
FIG. 3 is a block diagram showing an AOI system for inspecting electrical circuits, constructed and operative in accordance with an additional preferred embodiment of the present invention.

Reference is now made to FIG. 3 which is a block diagram showing an AOI system 40 for inspecting electrical circuits which is constructed and operative in accordance with a preferred embodiment of the present invention.

AOI system 40 preferably comprises a defect detector 42 (corresponding to defect detector 4 in FIG. 1) having circuitry operative to receive electrical circuit reference inputs 44 for an electrical circuit of the type to be inspected, and to receive inspection inputs, such as a representation of the electrical circuit 46 which is actually being inspected, which representation is generated by an electrical circuit inspector 48. Each feature such as feature 11 (FIG. 2) in the representation of an electrical circuit being inspected 46 preferably is specified by a record indicating its morphological type and its location. Each feature such as feature 11 (FIG. 2) in a reference electrical circuit 44, preferably is specified by a record indicating its morphological type, its location and a tolerance, such as indicated by location responsive tolerance input 9 (FIG. 1) indicating a distance by which the location of a corresponding matching feature 11 in representation 46 may be separated from the location indicated in reference 44, without being considered defective.

Defect detector 42 preferably matches corresponding features in reference 44 and representation 46 and provides a defect report 50 indicating defects in the manner described generally hereinabove with reference to FIG. 1. It is appreciated that defect detector 42 may perform various inspection functionalities in addition to feature matching. For example, defect detector 42 may determine whether a feature in representation 46 is properly formed. Defect detector 42 may also measure the nominal width of conductors 12 and spaces between conductors 12, compare detected widths of conductors and spaces to various design rules and report defective line widths and space widths. It is appreciated that a location responsive tolerance may apply to the width of lines and spaces between lines at various locations in an electrical circuit, for example as a function of the location of a conductor in an electrical circuit.

It is appreciated that a high degree of registration is required between reference 44 and representation 46 of an electrical circuit being inspected. Various well known alignment and registration methods may be employed. A preferred method for dynamically registering features in a reference 44 and features in a representation 46 is shown and described in U.S. Pat. No. 5,495,535 to Smilansky et. al. and assigned to Orbotech Ltd., the disclosure of which is hereby incorporated herein by reference.

In accordance with a preferred embodiment of the present invention, a tolerance is assigned to each feature specified in reference 44. Preferably the tolerance is a location responsive tolerance, or a tolerance provided as a function of one or more of location, proximity to other features, a morphology of features, a shape of features, average density of features in and electrical circuit, or portion thereof, a reflected intensity value, a color, or a material from which a feature is formed. For example, in an electrical circuit comprising features formed from different materials, such as conductors formed of copper and conductors that are gold plated, a tolerance may be assigned at least in part as a function of the material out of which a conductor is formed, a color of the material out of which the conductor is formed, or the intensity of light reflected by the feature. In an electrical circuit having regions in which the density of features is different, a tolerance may be assigned at least in part as a function of the density of features in the entire electrical circuit or in a portion thereof. A tolerance may be assigned at least in part as a function of an aberration in the shape of the feature. A tolerance may be assigned at least in part as a function of spaces measured between features. It is appreciated that logic may be applied to assign a tolerance on the basis of a location parameter, or on the basis of any combination of parameters relating to a spatial property, optical property, location, size, density, material, color, reflective properties, morphological type, shape, or any other suitable characteristic or combination of characteristics of a feature.

Reference 44 preferably is generated by an electrical circuit reference generator 60, preferably including the following modules: an electric circuit analyzer 62 operative to receive as an input a representation of a reference electrical circuit to be inspected 64 and to analyze the representation of a reference electrical circuit to be inspected 64 to identify the morphological type and location of each feature therein; a feature characteristic classifier 66 operative to receive as inputs user defined characteristic definitions 68 and the output of electrical circuit analyzer 62, and to classify features therein according to user defined characteristic definitions 68; and an adaptive inspection tolerance assignor 69 operative to receive as inputs user defined tolerances 70 relating to various characteristics, such as one or more of a spatial characteristic or an optical characteristic, including, a location parameter, a proximity parameter, a material, a color, a reflective property, and a density of features, and the output of feature characteristic classifier 66, and to assign to each feature therein an adaptive inspection tolerance in response to one or more of the characteristics by which the feature is classified by feature classifier 66.

Operation of the modules comprising electrical circuit reference generator 60, and their respective inputs, is now described hereinbelow in greater detail. Electrical circuit analyzer 62 preferably is operative to receive as an input a representation of a reference electrical circuit to be inspected 64, preferably in the form of CAD data, CAM data, an image of an electrical circuit known to be a good circuit, or any other image of an electrical circuit or portion of an electrical circuit suitable as a reference. Electrical circuit analyzer preferably is operative to detect features in the representation of a reference electrical circuit to be inspected 64 by computer analysis and to specify each feature detected therein at least by morphological type and its actual location the reference electrical circuit to be inspected 64.

Figure 4:
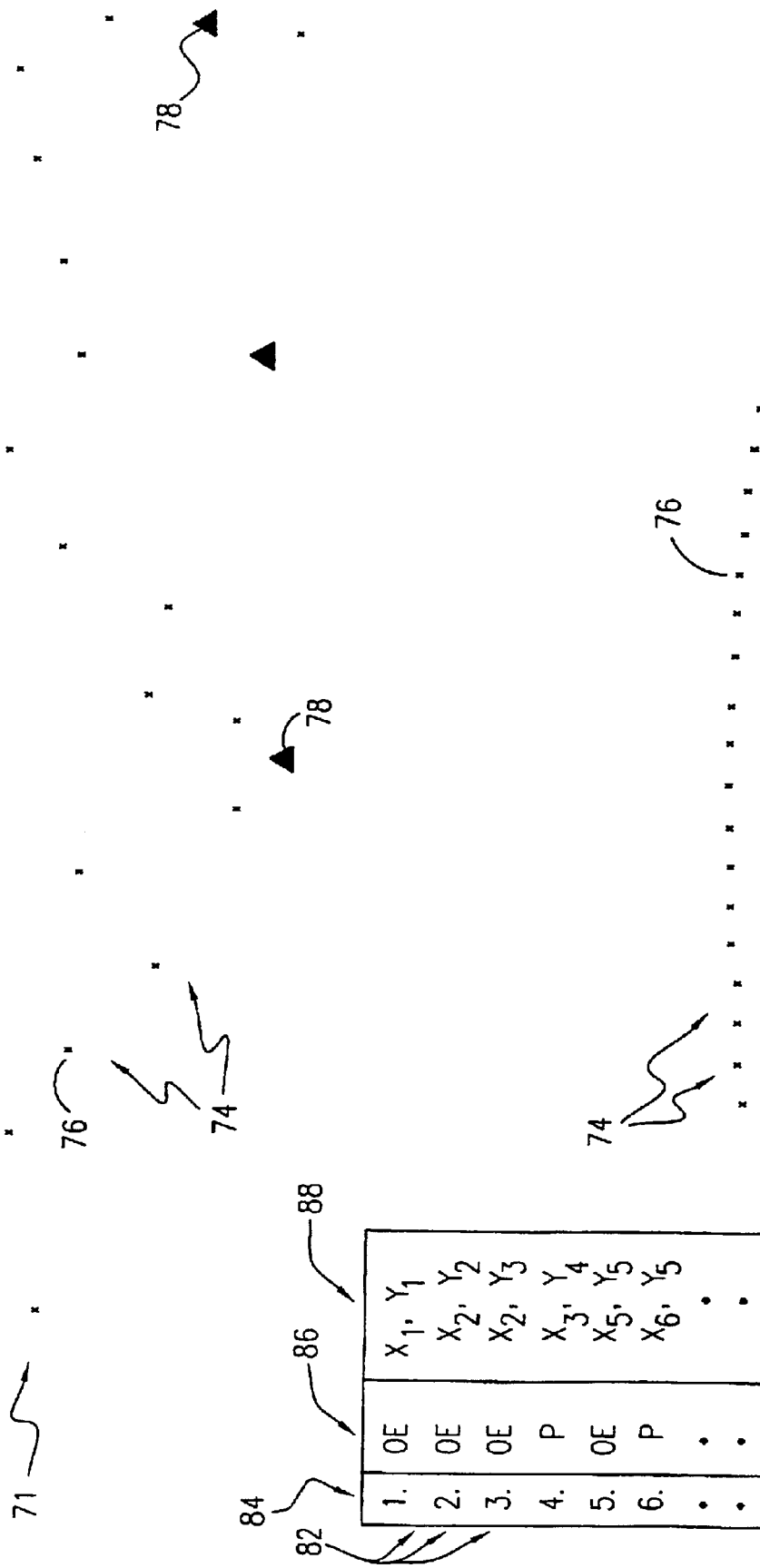
FIGS. 4A–4B are diagrams of reference electrical circuit data illustrative of outputs of an electrical circuit analyzer.

Reference is now made to FIG. 4A which is graphically represented reference electrical circuit data 71, illustrative of an output of electrical circuit analyzer 62. Graphically represented reference electrical circuit data 71 generally coincides with region 72 indicated in electrical circuit 10 of FIG. 2. As seen in FIG. 4A, each feature is specified by a marker 74 which indicates its respective morphological type and location in electrical circuit 10. Two morphological types of features are shown in graphically represented reference circuit data 71 of FIG. 4A: open ends 76, each of which is indicated by an "x", and pads 78, each of which is indicated by a triangle.

Reference is now made to FIG. 4B which is a simplified reference electrical circuit data file 80 corresponding to preferred output of electrical circuit analyzer 62. It is appreciated that the handling of information output by electrical circuit analyzer 62 generally is more efficient if provided in a non graphic format. Thus the output of electrical circuit analyzer 62 preferably is provided in an alphanumeric or other suitable machine readable format. Electrical circuit analyzer 62 preferably outputs an electrical circuit data file 80, which provides a record 82 for each feature in the representation of a reference electrical circuit to be inspected 64. Each record 82 preferably includes at least a placeholder 84, a morphological type code 86 (for example "oe" for an open end 16 or "p" for pad 18 are shown), and a location coordinate 88, preferably in the form of a Cartesian coordinate, polar coordinate or a coordinate in any other suitable coordinate system. Other additional information may be included in electrical circuit data file 80, for example information concerning a material or combination of materials, such as copper or gold, from which a feature is constructed, or a color of a feature. Information about the materials composition of features may be provided directly by CAD or CAM data, or may be detected preferably using methods shown and described in Applicants copending Israel Patent Application 131092 filed Jul. 25, 1999, incorporated herein by reference.

Feature characteristic classifier 66 preferably is operative to receive electrical circuit data file 80 and user defined characteristic definition inputs 68, and to classify each feature in electrical circuit data file 80 according to at least one user defined characteristic as contained in user defined characteristic definitions 68.

Typical characteristics used by feature characteristic classifier 66 to classify features 11 include the distance by which a feature is separated from other features 11 in reference electrical circuit to be inspected 64, the distance that a feature is separated from other features of the same morphological type in reference electrical circuit to be inspected 64, the actual spatial location of a feature in reference electrical circuit to be inspected 64, a material out of which a feature is constructed, the color of a feature, the morphological type of a feature, the density of features in the electrical circuit to be inspected 64, or portion thereof, the reflectivity of a feature in the electrical circuit to be inspected 64, an aberration in the shape of a feature in the electrical circuit to be inspected 64, or any other suitable characteristic. A feature may be classified by a single characteristic or by any combination of the above characteristics.

In the output of feature characteristic classifier 66, each feature is provided with a suitable indication corresponding to a characteristic or combination of characteristics by which it is classified.

Figure 5:
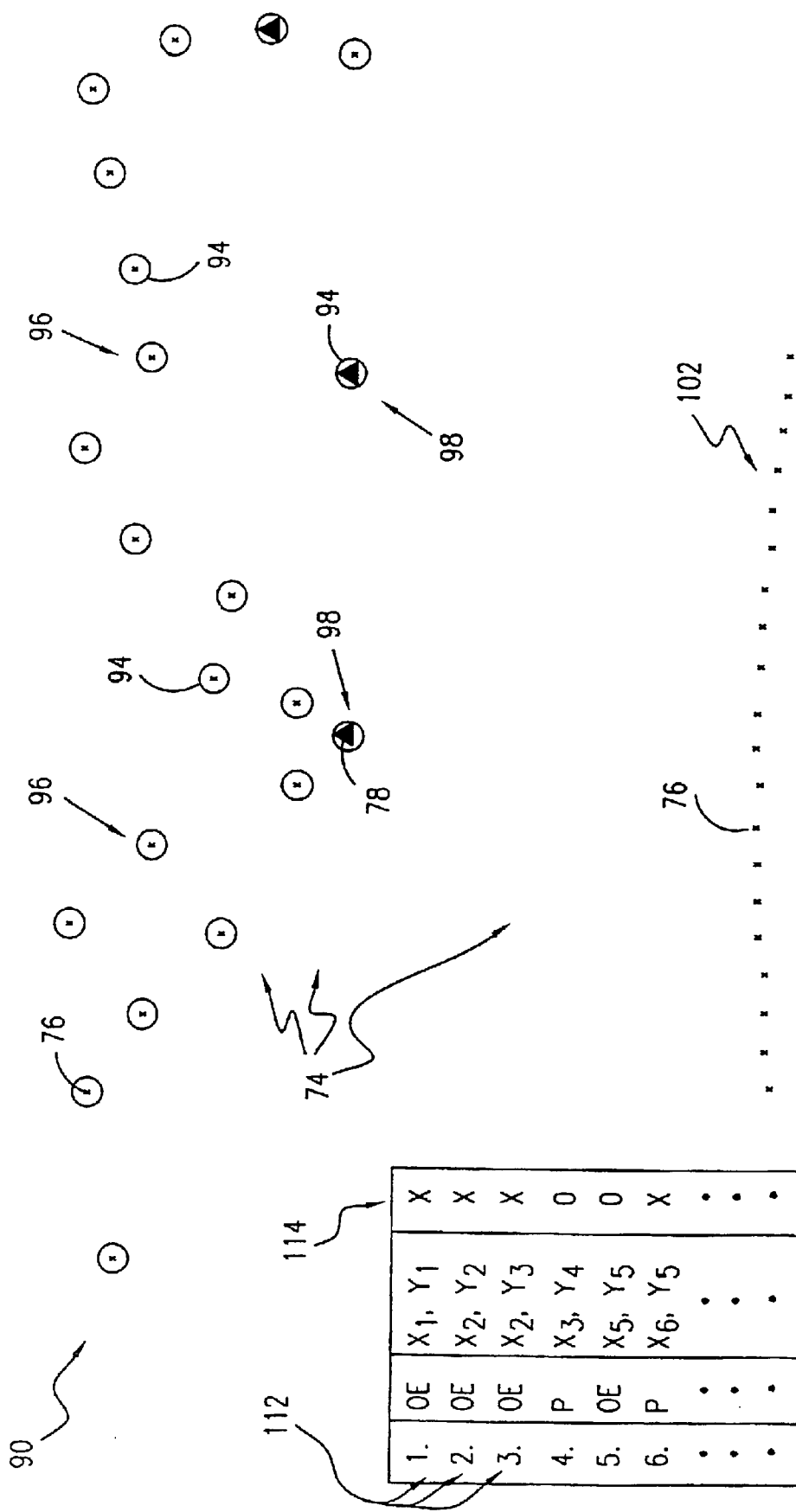
FIGS. 5A–5B are diagrams of characterized reference electrical circuit data illustrative of outputs of electrical circuit feature characteristic classifier.

Reference is now made to FIG. 5A which is graphically represented characterized reference electrical circuit data 90, illustrative of an output of electrical circuit feature characteristic classifier 66. Graphically represented characterized reference electrical circuit data 90 generally coincides with graphically represented reference electrical circuit data 71 (FIG. 4A), and includes a plurality of markers 74, corresponding to markers 74 in FIG. 4A, some of which include an additional characterization marking 94 as shown.

In accordance with a preferred embodiment of the present invention, features the reference electrical circuit to be inspected 64 are classified by feature characteristic classifier 66 according to their location in proximity to other features 11 of the same morphological type, or by some other characteristic or combination of characteristics as described hereinabove. Thus, inasmuch as features are characterized based on a spatial characteristic, for example whether they are isolated or non-isolated, a rule or threshold is applied by feature characteristic classifier 66. In FIG. 5A isolated features are shown with characterization marker 94 while non-isolated features are shown without characterization marker 94.

As seen in FIG. 5A, open ends 76 and pads 78 that have a characterization marker 94 associated therewith are isolated open ends 96 and isolated pads 98 respectively. Open ends 76 and pads 78 that do not have a characterization marker 94 associated therewith are non-isolated open ends 102 and non-isolated pads (not shown) respectively.

Various logic may be employed to apply rules, thresholds, other suitable definitions, and combinations thereof to classify features, as illustrated by the following non-limiting examples of how features may be classified by feature classifier 66:

EXAMPLE I

Any feature that is separated from all neighboring features of the same morphological type by at least 5 mils is an isolated feature, while any feature that is separated from any neighbor of the same morphological type by less than 5 mils is a non-isolated feature.

EXAMPLE II

A first distance threshold, for example 5 mils between neighboring open ends 76 is employed to classify open ends 76 as isolated or non-isolated, while a second distance threshold, for example 8 mils, is used to define whether a pad 78 is isolated or non-isolated.

EXAMPLE III

A dual threshold is provided to define whether a feature, such as an open end 76, is isolated or non-isolated. Thus in order to be classified as an isolated open end 96, an open end must be separated by at least a first threshold distance, for example 5 mils, from any neighboring open end, and must be separated by at least a second threshold distance, for example 3 mils, from a neighboring feature of any other morphological type. An appropriately adjusted dual threshold may apply to other features, such as pads 78, to determine whether they are isolated or non-isolated.

EXAMPLE IV

A dual threshold, such as is exemplified in Example II, is separately provided for each type of morphological feature. Thus, a shown in the illustration of FIG. 5A, an open end 76 is defined as an isolated open end 96 only if it is separated from the next closest open end 96 by at least 5 mils, and if it is separated from the next closest feature of any other type by at least 3 mils. A pad 78 is defined as an isolated pad 98 only if it is separated by at least 8 mils from the next closest pad 78 and if it is separated from the next closest feature of any other type by at least 3 mils.

EXAMPLE V

A dual threshold, such as is exemplified in Example II, is applied to a first morphological feature type, while a simple threshold is applied to other morphological feature types. Thus, a dual threshold is applied to open ends 76, while pads 78 are classified as isolated or non-isolated simply by evaluation of their proximity to another feature of any morphological type.

EXAMPLE VI

Spatial regions of interest are defined in user defined characteristic definitions 68, for example a region 102 in FIG. 2. A first distance threshold, for example 5 mils between neighboring open ends 76, is provided in user defined characteristic definitions 68 to define whether an open end 76 is an isolated or non-isolated. The distance threshold is applied only to open ends that are located inside region 102. By default all open ends that are not in region 102 are deemed non-isolated.

EXAMPLE VII

Spatial regions of interest and materials of interest, namely materials out of which a conductor is formed, are defined in user defined characteristic definitions 68. A spatial region of interest may be region 102 in FIG. 1. Materials of interest may be copper and gold. Information about the material out of which a conductor is formed may be obtained from CAD or CAM data relating to an electrical circuit 10 to be inspected, or by inspection using systems and methods shown and described in Applicant's copending Israel Patent Application 131092 filed Jul. 25, 1999, incorporated herein by reference.

A first distance threshold, for example 5 mils between neighboring pads 78, is applied to classify pads 78 is isolated or non-isolated. The distance threshold is applied only to pads 78 that are located inside region of interest 102, and provided that they are copper. All copper pads 76 that are outside region of interest 102 are deemed isolated. All gold pads 76 are classified as non-isolated, regardless of their location.

EXAMPLE VIII

The same logic is used as in example VII however instead of classifying features by a material from which they are formed, a color or threshold for reflectivity of the feature is applied.

EXAMPLE IX

An electrical circuit is divided into spatial regions and a feature is designated as isolated or non-isolated as a function of the density of features in the spatial region in which it is located. Thus, a feature is isolated if in the spatial region in which it is located there are less than twenty features, such as open ends 76 per square inch, and non-isolated if there are greater than twenty features per square inch. A computation of density may be made by counting the number of features, or a particular type of feature, and dividing by the size of a region in which they are located.

Reference is now made to FIG. 5B which is which is a simplified characterized reference electrical circuit data file 110 corresponding to an output of feature characteristic classifier 66. Characterized reference electrical circuit data file 110 generally corresponds to electrical circuit data file 80 (FIG. 4B). Characterized data file 110 includes a multiplicity of records 112, each of which preferably corresponds in content to a record 82 in electrical circuit data file 80 and provides an additional indication relating to a characteristic 114 by which a feature, represented by a record 112, is classified.

Referring back to FIG. 3, inspection tolerance assignor 69 preferably is operative to receive the characterized reference electrical circuit data file 110 output by feature characteristic classifier 66 and user defined tolerance inputs 70 relating to the tolerances that apply to various feature characteristics. Inspection tolerance assignor assigns a user defined tolerance 70 to each feature represented by a record 112 in characterized reference electrical circuit data file 110. In accordance with a preferred embodiment of the present invention, the assignment of a user defined tolerance 70 to a record 112 representing a feature is done in response to a characteristic of the feature. Thus, for example, a feature that is classified as a non-isolated feature, a feature in a spatial region, a dense feature, a copper feature, a copper colored feature, or a highly reflective feature would be assigned a first user defined tolerance while a similar feature that is characterized as an isolated feature, a feature outside a spatial region, a sparse feature, a gold feature, a gold colored feature, or a relatively non-reflective feature would be assigned a second user defined tolerance, different from the first user tolerance. In this manner, each class of features classified by feature characteristic classifier 66 may be assigned a different tolerance. Moreover, greater than two alternatives for tolerances may be provided and user defined tolerances 70 may be adjusted by a user without affecting how a feature is classified.

Figure 6:
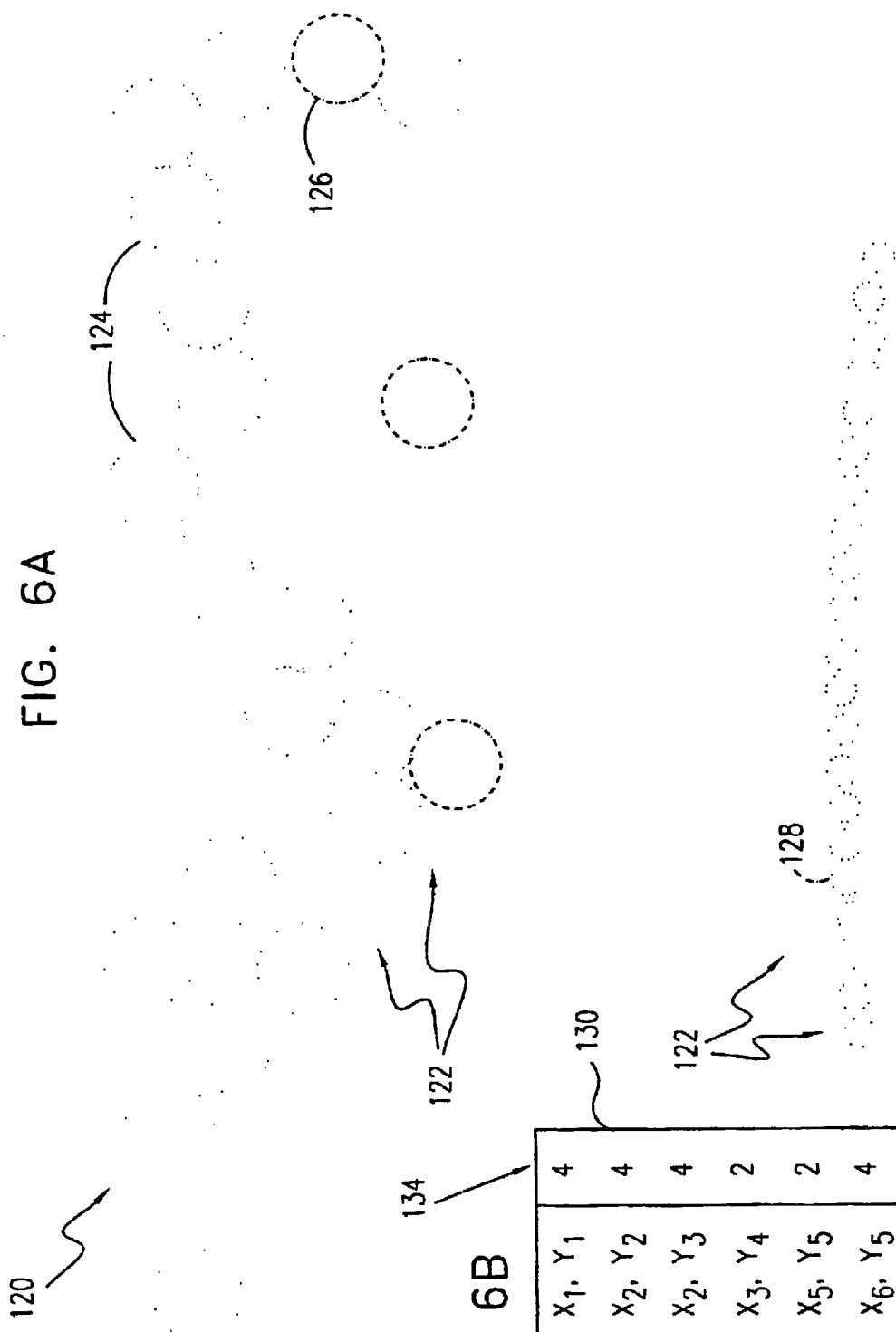
FIGS. 6A–6B are diagrams of reference electrical circuit representations illustrative of a portion of an electrical circuit reference.

Reference is now made to FIG. 6A which is a simplified graphic reference electrical circuit representation 120, illustrative of portion of an electrical circuit reference 44 (FIG. 2), output by inspection tolerance assignor 69. As shown in FIG. 6A different target regions 122, are provided. Each target region 122 corresponds to a feature represented by a marker 74 in FIG. 5A or record 112 in FIG. 5B and represents an acceptable tolerance for separation between corresponding matching features in electrical circuit reference 44 and in representation of electrical circuit being inspected 46.

In graphic reference electrical circuit representation 120 there are thus shown: large open end target areas 124, assigned by adaptive inspection tolerance assignor 69 to open ends 76 that are characterized as isolated open ends 96 (FIG. 5A); large pad target areas 126, assigned by adaptive inspection tolerance assignor 69 to pads 78 that are characterized as isolated pads 98; and small open end target areas 128, assigned by adaptive inspection tolerance assignor 69 to open ends 76 that are characterized as non-isolated open ends 102. Although target areas 122 are depicted as circular targets, it is appreciated that target areas may be rectangular in any other suitable shape.

Reference is now made to FIG. 6B which is which is a simplified electrical circuit reference file 130 illustrative of electrical circuit reference 44 in FIG. 3. Reference file 130 preferably includes a multiplicity of records 132, each of which preferably corresponds in content to records 112 in characterized reference electrical circuit data file 110 and provides an indication of a tolerance 134 assigned to the feature which it represents. A tolerance may be indicated by any suitable code, for example a radius of a target are 122 representing a tolerance.

It is noted that user defined tolerances 70 preferably are provided and are applied separately from user defined characteristic definitions 68. This allows user defined tolerances 70 to be adjusted for characteristics independently of user defined characteristic 68 used to classify features. Thus, for example, in examples shown hereinabove with respect to an isolated and non-isolated feature, features may be identified in a first step prior to inspection as being isolated or non-isolated, based upon their separation from other features. The characterized reference electrical circuit data file 110 may be stored for later use. During inspection user tolerances 70 may be adjusted or changed, independently of the classification, and merged with the classification on-the-fly in order to obtain optimal inspection results.

It is appreciated that while each of modules 62, 66 and 69 which comprise electrical circuit reference generator 60 are described hereinabove as discrete modules, their functionality may combined or rearranged in any suitable manner. The functionality of electrical circuit generator may be performed entirely prior to inspection and detection performed by defect detector 42, or partly prior to and concurrent with inspection and detection performed by defect detector 42. Likewise, the functionality provided by electrical circuit reference generator 60 may be performed on equipment and/or circuitry dedicated to generating an electrical circuit reference, in whole or in part on the same equipment and circuitry that comprises electrical circuit inspector 48 and/or defect detector 42, or by software, or by dedicated hardware.

Figure 7:
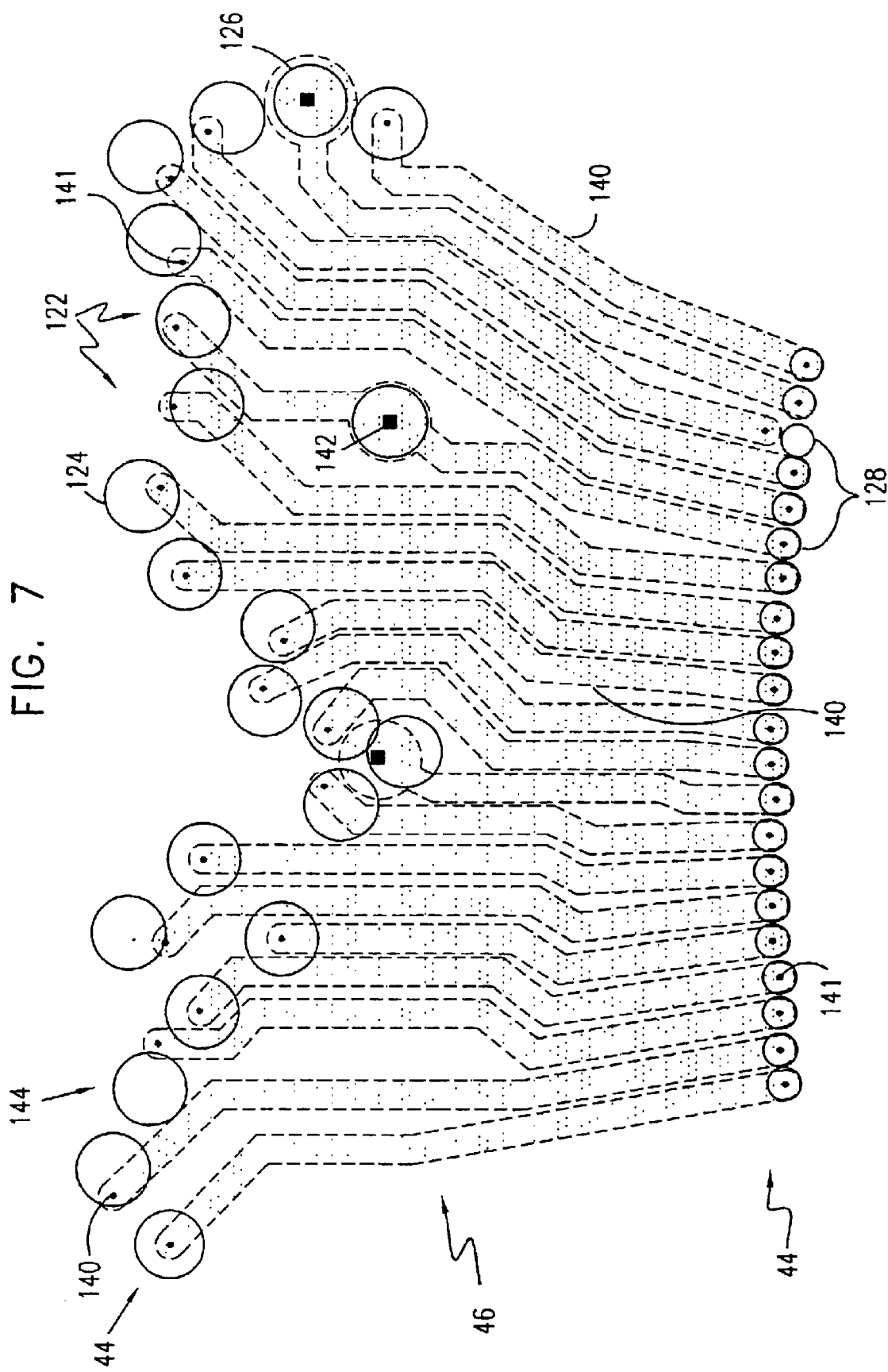
FIG. 7 is a simplified graphic representation of feature matching step performed by a defect detector in accordance with a preferred embodiment of the present invention.

Reference is now made to FIG. 7 which is a simplified graphic representation of a matching step preferably performed by defect detector 42 between portions of electrical circuit reference 44 and portions of a representation of an electrical circuit being inspected 46. Electrical circuit reference 44 is shown as a collection of target regions 122 corresponding to graphic reference electrical circuit representation 120 of FIG. 6A. A representation of an electrical circuit being inspected 46, having conductors 140 (reference numeral 12 in FIG. 2) is shown superimposed on electrical circuit reference 44. The representation of an electrical circuit being inspected 46 includes representations for open ends 141 and pads 142. It is seen that: large open end target areas 124 are assigned, for example by adaptive inspection tolerance assignor 69, to open ends 76 in FIG. 5A that are characterized as isolated open ends 96; large pad target areas 126 are assigned, for example by adaptive inspection tolerance assignor 69, to pads 78 in FIG. 5A that are characterized as isolated pads 98; and that small open end target areas 128 are assigned, for example by adaptive inspection tolerance assignor 69, to open ends 76 in FIG. 5A that are characterized as non-isolated open ends 102.

As seen in FIG. 7, most representations of open ends 141 and pads 142 in representation 46 are located inside a corresponding matching target area 122, the size of which is a function of a characteristic such as its proximity (or conversely, its separation) from other features. As long as an open end 141 and pad 142 in representation 46 is located inside its corresponding target area 122, representing a tolerance, a valid non-defective match is made. Several representations of open ends 141 are located outside a corresponding target area 122, for example defective pair 144. Each defective pair 144 is reported in defect report 50. Thus it is appreciated that the size of a target area, which is assigned as a function of a characteristic of a feature, determines the precision with which an open end 141 and a pad 142 needs to be located in an electrical circuit being inspected.

Figure 8:
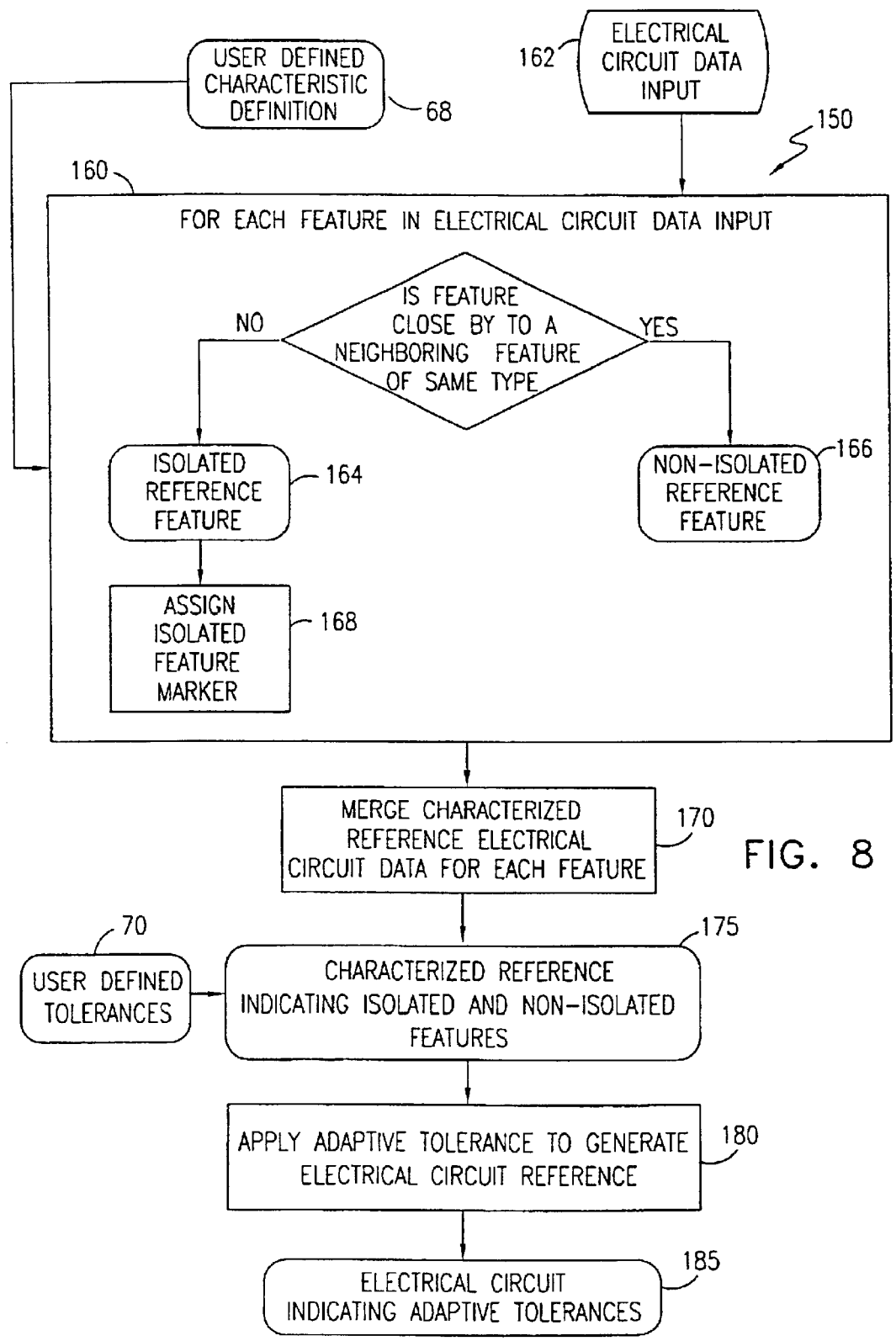
FIG. 8 is a flow diagram illustrating a preferred method for generating an electrical circuit reference in accordance with a preferred embodiment of the present invention.

Reference is now made to FIG. 8 which is a flow diagram 150 illustrating a preferred method for generating an electrical circuit reference 44 in accordance with a preferred embodiment of the invention.

STEP 160: Each feature in a reference electrical circuit data input 162, preferably reference electrical circuit data file 80 (FIG. 4B) is analyzed with reference to user defined characteristic definitions 68 (FIG. 3), for example with reference to a separation threshold defining whether a feature is an isolated reference feature 164 or a non-isolated reference feature 166. If the distance between neighboring features is greater than the threshold, then the feature is classified as isolated and an isolated feature classifier marking is assigned (168). If the distance between neighboring features is less than the threshold, then the feature is classified as non-isolated. In the example of FIG. 8, it is only shown that the characteristic of the feature evaluated is binary in nature, namely whether it is isolated or non-isolated. Thus, in the preferred method shown, features that are classified as not isolated may be assigned an appropriate non-isolated classifier marker, or no classifier marker indicating its classification by default. It is appreciated that non-binary encoding, or other suitable markings, may be used to specify classification when a number of classifications, greater than two, is used to classify features.

STEP 170: Records representing the features in electrical circuit data input 162 and including respective classifier markings for each feature are merged to generate a characterized reference file 175, corresponding to characterized reference electrical circuit data file 110 (FIG. 5B). Characterized reference file 175 preferably is generated in STEPS 160 and 170 prior to inspecting a batch of electrical circuits and is stored electronically for later use during inspection as described in greater detail hereinbelow.

STEP 180: Inputs from characterized reference file 175 and user defined tolerances 68 (FIG. 3) are merged to generate an electrical circuit reference 185 which indicates for each feature an adaptive tolerances assigned as a function of a characteristic of the feature. User defined tolerances 68 preferably are provided interactively prior to the inspection of an electrical circuit 10, or batch of electrical circuits 10, in response to inspection requirements of the electrical circuit 10. In accordance with a preferred method, user defined tolerances are entered interactively, are stored in computer memory (not shown) and are merged with the inputs from characterized reference file on the fly during inspection. Alternatively, in accordance with another preferred method, user defined tolerances are provided interactively, and are merged with the inputs from characterized reference file 175 prior to inspecting electrical circuits 10. The entire electrical circuit reference 185 is stored in computer memory 185 for use during inspection. The choice of which preferred method is used generally is a function of optimizing one or more of computer processing, computer memory and operator time resources.

Figure 9:
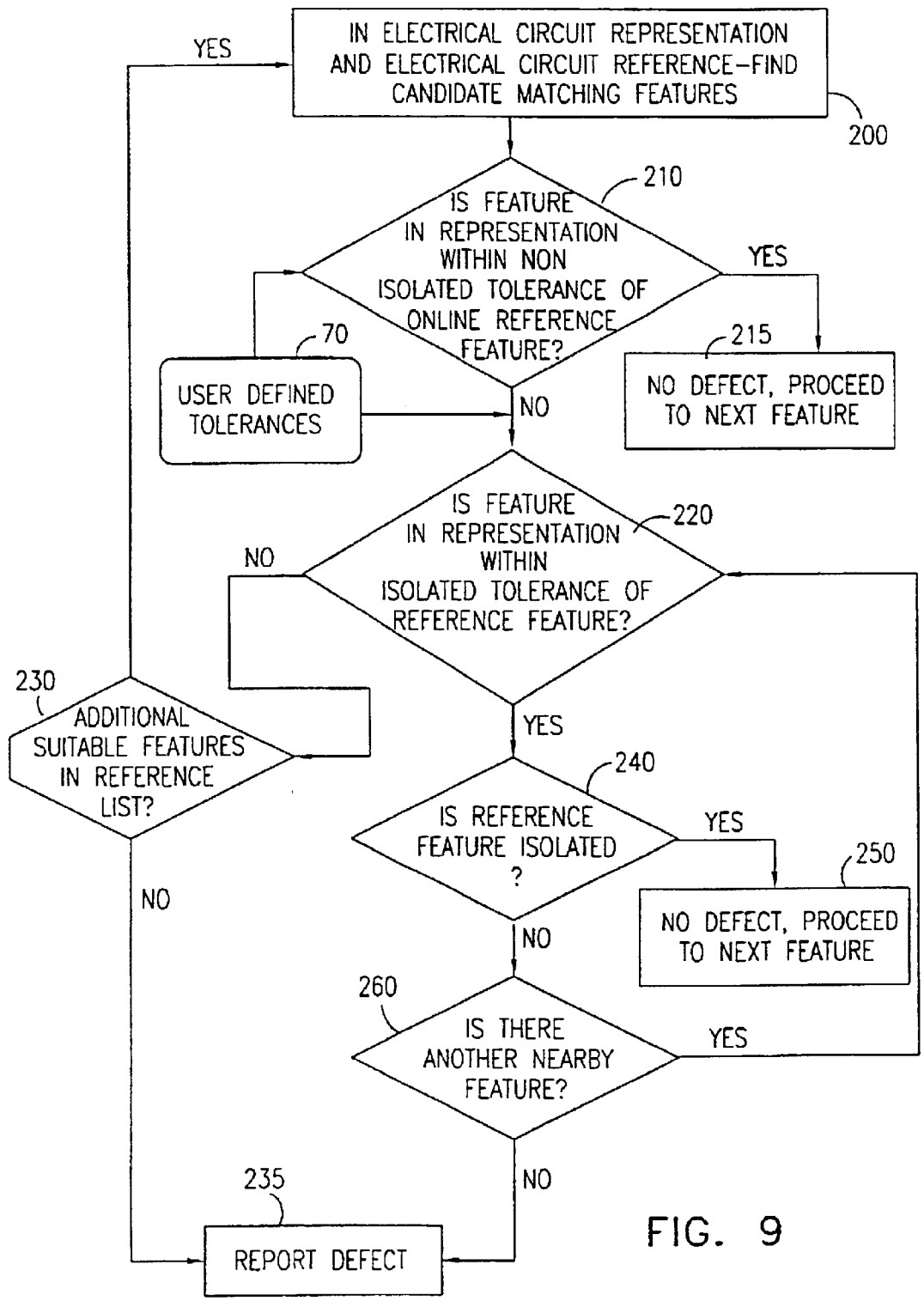
FIG. 9 is a flow diagram illustrating a preferred method employed in a defect detector for matching features in accordance with a preferred embodiment of the present invention.

Reference is now made to FIG. 9 which is a flow diagram illustrating a preferred method employed in defect detector 42 of FIG. 3 for matching features in representation 46 to features in reference 44.

STEP 200: For a record 132 (FIG. 6A) representing a feature in reference 44 find a corresponding matching candidate feature in representation 46. Each matching candidate feature pair is preferably of the same morphological type and the location of each feature in the pair must be separated from the corresponding location of the other feature in the pair by less than a threshold that is provided in a system definition.

STEP 210: Evaluate whether the separation between the location of the feature in representation 46 and its corresponding matching feature in reference 44 is less than a tolerance, preferably a user defined tolerance 70 (FIG. 3), applicable to non-isolated features.

If the distance is within the tolerance for a non-isolated feature, as provided by a user defined tolerance input 70, then the feature is not defective, and the routine continues to evaluate another pair of features (Step 215).

STEP 220: If the separation between the location of the feature in representation 46 and its corresponding matching feature in reference 44 is greater than the permitted tolerance for a non-isolated feature, then the pair of features 11 is evaluated to determined whether the distance is less than the tolerance, preferably provided by user defined tolerance inputs 70, applicable to isolated features.

STEP 230: If the result of STEP 220 is that the separation between the respective locations of a pair of corresponding matching features in the representation 46 and reference 44 is greater than the tolerance applying to an isolated feature, then representation 46 is evaluated to determine whether there is another suitable candidate matching feature. If there is another suitable candidate matching feature, then the routine loops to Step 200. If there is no other suitable candidate matching feature, then a defect report 235 is issued.

STEP 240: If STEP 220 returns a result that the separation in between the location of a pair of corresponding matching features in representation 46 and reference 44 is less than the tolerance applicable to an isolated feature, then the feature in reference 44 is evaluated to determine whether it is an isolated feature.

STEP 250: If STEP 240 returns a result that the feature in reference 44 is an isolated feature, then no defect is detected and the routine returns to STEP 200 to evaluate another pair of candidate matching features.

STEP 260: If STEP 240 returns a result that the feature in reference 44 is not an isolated feature, than prior to issuing a defect report 235, representation 44 is evaluated to determine whether there is another suitable candidate matching feature to pair with the feature in reference 46. If there is another suitable candidate matching feature in representation 46 that is nearby to the feature in reference 46, then the routine is looped to STEP 220.

If there are no other candidate corresponding matching features to pair with feature in reference 46, then a defect is reported (235).

Figure 10:
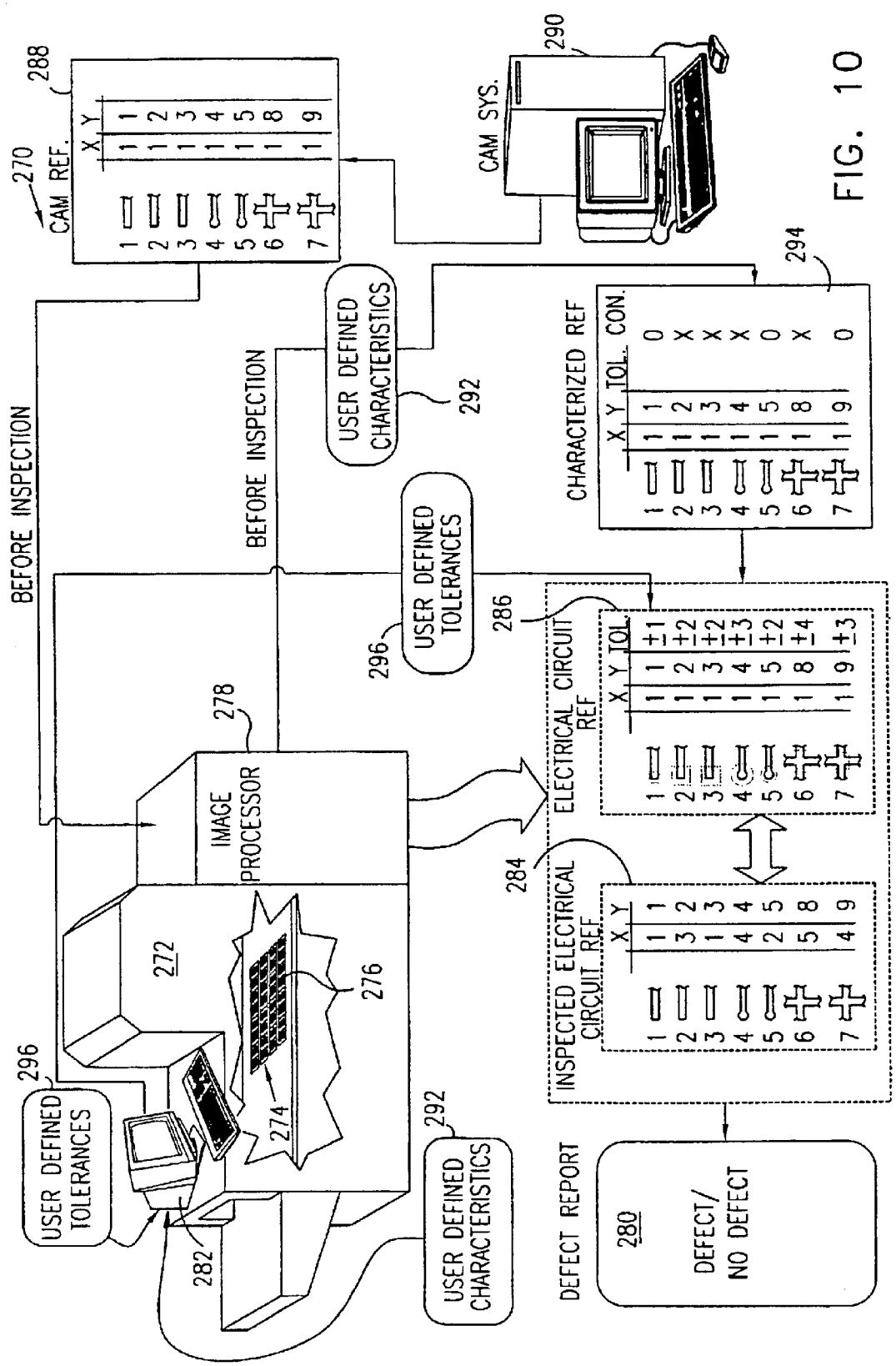
FIG. 10 is a simplified pictorial illustration of an AOI system for inspecting electrical circuits constructed and operative in accordance with a preferred embodiment of the present invention.

Reference is now made to FIG. 10 which is a simplified pictorial illustration of an AOI system 270 for inspecting electrical circuits constructed and operative in accordance with a preferred embodiment of the present invention.

Automated optical inspection system 270, preferably includes a PC-1490 Micro AOI system available from Orbotech Ltd. of Yavne, Israel, and comprises an inspection station 272 operative to optically inspect and acquire images of panels 274, having located thereon electrical circuits 276, such as electrical circuits 10 in FIG. 2. System 270 preferably further includes an image processor 278 having circuitry that is operative to analyze images of panels 274 received from inspection station 272, to process the images and perform automated computer analysis of various patterns formed therein by electrical circuits 276, and to output a defect report 280 indicating portions of panel 274 suspected as being defective. A computer workstation 282 is provided to enable an operator to control and operate inspection system 270, for example by inputting various commands and parameters used by system 270 used by image processor 278 to process images of panels 274.

During the inspection of a panel 274, image processor 278 generates an inspected electrical circuit reference file 284 and, at least in part, matches features detected therein to corresponding matching features in an electrical circuit reference file 286.

Electrical circuit reference file 286 preferably is generated on the fly during inspection of panel 274, or immediately preceding inspection of panel 274 (or a batch of panels 274) as follows: Prior to commencing inspection of panel 274, a "golden" image 288 representing the type of panel 274 to be inspected, preferably is obtained from a CAM system 290, such as an Xpert 1700 CAM system available from Frontline Solutions Ltd. and Orbotech Ltd., both of Yavne, Israel, and is subjected to analysis and processing by image processor 278. Analysis and processing by image processor 278 detects the morphological feature type and location of each feature in golden image 288, and classifies each feature according to one or more user defined characteristics 292 (reference numeral 68 in FIG. 3) to generate a characterized reference 294. User defined characteristic 292 is preferably is one or more of a spatial threshold defining a proximity between neighboring features, and may be a spatial location or locations on panel 274, a material, a color, a reflectivity threshold, a density of features, a morphological feature type, a shape aberration, or some other characteristic or combination of characteristics by which a feature may be defined as described hereinabove with reference to FIG. 3. The characterized reference 294 resulting from the above analysis and processing is stored in computer memory for later use.

Prior to inspecting a batch of panels 274 various user defined tolerances 296, relating to one or more characteristics by which a feature may be classified by image processor 278 as described hereinabove are input into at workstation 282, and are stored in memory. Electrical circuit reference 286 preferably is generated during the inspection of panel 274, or generated prior to inspection and stored in memory, by merging characterized reference 294 and user defined tolerances 296. The appropriate user defined tolerance 296 is applied to each feature according to its characteristic. Defects arising from separation in the respective locations of corresponding matching features in the inspected electrical circuit representation 284 and the electrical circuit reference 286 are determined with reference to the applicable user defined tolerance 296, each of which is thus applied as a function of a feature characteristic as described hereinabove.

It is appreciated that various features of the invention which are, for clarity, described in the contexts of separate embodiments may also be provided in combination in a single embodiment. Conversely, various features of the invention which are, for brevity, described in the context of a single embodiment may also be provided separately or in any suitable subcombination.

It will be appreciated by persons skilled in the art that the present invention is not limited to what has been particularly shown and described hereinabove. Rather, the scope of the present invention is defined only by the claims that follow:

What is claimed is:

1. A system for inspecting electrical circuits, comprising:
   a proximity indicator operating on a computer file of an electrical circuit to be inspected for indicating the proximity of at least a first portion of the electrical circuit to be inspected to at least a second portion of the electrical circuit to be inspected;
   circuitry providing a tolerance output based on the proximity of said at least a first portion of the electrical circuit to be inspected to said at least a second portion of the electrical circuit to be inspected; and
   fault detection circuitry operative in response to inspection inputs acquired from an electrical circuit being inspected to provide an output indication of faults in said electrical circuit being inspected based at least in part on said tolerance output.

2. A system for inspecting electrical circuits according to claim 1, wherein said first portion and said second portion are features in the electrical circuit.

3. A system for inspecting electrical circuits according to claim 2, wherein said features are one of an open end, a pad, a junction.

4. A system for inspecting electrical circuits according to claim 2, wherein the proximity indicator is operative to indicate the proximity between two features having a same morphological type.

5. A system for inspecting electrical circuits according to claim 2, wherein the proximity indicator is operative to indicate the proximity between two features having a different morphological type.

6. A system for inspecting electrical circuits according to claim 1, wherein the tolerance is a permitted spatial separation between a feature of a reference electrical circuit and a corresponding feature of an electrical circuit being inspected.

7. A system for inspecting electrical circuits according to claim 6, wherein a feature is classified as being one of isolated and non-isolated with reference to a spatial separation threshold between the features, and the tolerance for a feature that is classified as isolated is greater than the tolerance for a first portion that is nonisolated.

8. A system for inspecting electrical circuits according to claim 6, wherein the tolerance for an isolated feature of a first morphological type is different than the tolerance for an isolated feature of a second morphological type.

9. A system for inspecting electrical circuits according to claim 6, wherein the tolerance for non-isolated feature of a first morphological type is different than the tolerance for a non-isolated feature of a second morphological type.

10. A system for inspecting electrical circuits according to claim 6, wherein the tolerance for an isolated feature in a defined spatial region is different than the tolerance for an isolated feature outside the defined spatial region.

11. A system for inspecting electrical circuits according to claim 6, wherein the tolerance for a non-isolated feature in a defined spatial region is different than the tolerance for a non-isolated feature outside the defined spatial region.

12. A system for inspecting electrical circuits according to claim 6, wherein the tolerance for an isolated feature having a predetermined color is different than the tolerance for an isolated feature having a color other than the predetermined color.

13. A system for inspecting electrical circuits according to claim 6, wherein the tolerance for a non-isolated feature having a predetermined color is different than the tolerance for a non-isolated feature having a color other than the predetermined color.

14. A system for inspecting electrical circuits according to claim 6, wherein the tolerance for an isolated feature formed of a predetermined material is different than the tolerance for an isolated feature formed of a material other than the predetermined material.

15. A system for inspecting electrical circuits according to claim 6, wherein the tolerance for a non-isolated feature formed of a predetermined material is different than the tolerance for a non-isolated feature formed of a material other than the predetermined material.

16. A system for inspecting electrical circuits according to claim 6, wherein a feature in an electrical circuit being inspected is not defective if it is separated from the location of a matching feature in the reference electrical circuit by less than the tolerance applying to an isolated feature.

17. A system for inspecting electrical circuits according to claim 6, wherein a feature in an electrical circuit being inspected is not defective if the location of said feature in the electrical circuit being inspected is separated from the location of a corresponding feature in the reference electrical circuit by greater than the tolerance for a non-isolated feature, and less than the tolerance for an isolated feature, and the feature is isolated.

18. A system for inspecting electrical circuits, comprising:
    a tolerance indicator for providing a tolerance output based on at least one spatial characteristic of an electrical circuit as determined from analysis of a reference representation corresponding to an electrical circuit to be inspected, said tolerance output indicating a permitted separation between corresponding matching features in said reference representation and in an electrical circuit to be inspected; and
    fault detection circuitry operative in response to inspection inputs received from inspecting an electrical circuit to be inspected, said fault detection circuitry being configured to provide an output indication of faults in said electrical circuit to be inspected based at least in part on said tolerance output.

19. A system for inspecting electrical circuits according to claim 18, wherein the spatial characteristic is a spatial characteristic in a reference representation of corresponding to the same type of electrical circuit as the electrical circuit to be inspected.

20. A system for inspecting electrical circuits according to claim 18, wherein the spatial characteristic is a spatial location in the electrical circuit to be inspected.

21. A system for inspecting electrical circuits according to claim 18, wherein the spatial characteristic is separation between the location of a first feature and the location of second feature.

22. A system for inspecting electrical circuits according to claim 21, wherein the first feature and the second feature are of the same morphological type.

23. A system for inspecting electrical circuits according to claim 21, wherein the first feature and the second feature are of different morphological types.

24. A system for inspecting electrical circuits according to claim 18, wherein the at least one spatial characteristic is a measure of isolation of a feature, and a first feature whose location is spatially separated from the location of a second feature by more than a threshold is an isolated feature.

25. A system for inspecting electrical circuits according to claim 18, wherein the at least one spatial characteristic is a measure of isolation of a feature, and a first feature whose location is spatially separated from the location of a second feature by less than a threshold is a non-isolated feature.

26. A system for inspecting electrical circuits according to claim 25, wherein the threshold is provided as a user input.

27. A system for inspecting electrical circuits according to claim 24, wherein the tolerance provided for an isolated feature is greater than the tolerance provided for a non-isolated feature.

28. A system for inspecting electrical circuits according to claim 25, wherein the tolerance provided for an isolated feature is greater than the tolerance provided for a non-isolated feature.

29. A system for inspecting electrical circuits according to claim 18, wherein the spatial characteristic is the presence of the feature in a predefined spatial region in an electrical circuit.

30. A system for inspecting electrical circuits according to claim 24, wherein the tolerance provided for an isolated feature inside a predefined spatial region is different than the tolerance for an isolated feature outside the spatial region.

31. A system for inspecting electrical circuits according to claim 29, wherein the tolerance provided for an isolated feature inside the spatial region is different than the tolerance for an isolated feature outside the spatial region.

32. A system for inspecting electrical circuits according to claim 25, wherein the tolerance provided for a non-isolated feature inside the spatial region is different than the tolerance for a non-isolated feature outside the spatial region.

33. A system for inspecting electrical circuits according to claim 29, wherein the tolerance provided for a non-isolated feature inside the spatial region is different than the tolerance for a non-isolated feature outside the spatial region.

34. A system for inspecting electrical circuits according to claim 18, wherein a feature in said inspection inputs is not-faulty if a separation between the location of the feature and the location of a corresponding feature in a reference for the electrical circuit is less than the tolerance for a non-isolated feature.

35. A system for inspecting electrical circuits according to claim 25, wherein a feature in said inspection inputs is not-faulty if the separation of the location of the feature and the location of a corresponding feature in a reference for the electrical circuit is less than the tolerance for a non-isolated feature.

36. A system for inspecting electrical circuits according to claim 18, wherein a feature in said inspection inputs is not-faulty if the separation of the location of the feature and the location of a corresponding feature in a reference for the electrical circuit is less than the tolerance for an isolated feature, and the feature is an isolated feature.

37. A system for inspecting electrical circuits according to claim 24, wherein a feature in said inspection inputs is not-faulty if the separation of the location of the feature and the location of a corresponding feature in a reference for the electrical circuit is less than the tolerance for an isolated feature, and the feature is an isolated feature.

38. A system for inspecting electrical circuits according to claim 18, wherein the spatial characteristic is a density of features in the electrical circuit at least in a portion of the electrical circuit surrounding the feature.

39. A method for preparing a reference for use in inspecting electrical circuits, comprising:
    receiving a representation of an electrical circuit to be inspected, prior to inspecting an electrical circuit corresponding to the representation;
    analyzing the representation to classify at least one portion of the representation according to a spatial characteristic; and
    assigning a tolerance to the at least one portion as a function of the spatial characteristic, said tolerance indicating a permissible separation between corresponding matching features in the representation and an electrical circuit being inspected, said tolerance to be used when inspecting an electrical circuit corresponding to the representation.

40. A method for preparing a reference according to claim 39, wherein the representation received comprises CAM data for the electrical circuit.

41. A method for preparing a reference according to claim 39, wherein the representation comprises CAD data for the electrical circuit.

42. A method for preparing a reference according to claim 39, wherein the representation comprises an image for a known good electrical circuit of the same type as the electrical circuit.

43. A method for preparing a reference according to claim 39, wherein the spatial characteristic is a separation between a first portion in the representation and a second portion in the representation.

44. A method for preparing a reference according to claim 39, wherein the portion is a feature and the spatial characteristic is the spatial location of the feature in the electrical circuit.

45. A method for preparing a reference according to claim 39, wherein a first tolerance is assigned to portions having a first spatial characteristic, and a second tolerance is assigned to portions having a second spatial characteristic different from the first spatial characteristic.

46. A method for preparing a reference according to claim 44, wherein a first tolerance is assigned to portions having a first spatial characteristic, and a second tolerance is assigned to portions having a second spatial characteristic different from the first spatial characteristic.

47. A method for inspecting electrical circuits, comprising:

receiving a representation of an electrical circuit to be inspected, prior to inspecting the electrical circuit;

analyzing the representation to classify at least two portions of the representation according to at least one spatial characteristic;

assigning a first inspection operation to a first portion having a first classification, the first inspection operation including an indication of a permissible separation between corresponding matching features in the representation and an electrical circuit being inspected;

assigning a second inspection operation to a second portion having a second classification, the second inspection operation including an indication of a permissible separation between corresponding matching features in the representation and in the electrical circuit being inspected;

inspecting an in fabrication electrical circuit with an automated optical inspection device at least using the first inspection operation to inspect those of the at least two portions having the first classification and using the second inspection operation to inspect those of the at least two portions having the second classification; and outputting indications of faults in the electrical circuit at least partly in response to using the first inspection routine and the second inspection routine.

48. The method claimed in claim 47, wherein the representation comprises CAM data for the electrical circuit.

49. The method claimed in claim 47, wherein the representation comprises CAD data for the electrical circuit.

50. The method claimed in claim 47, and wherein the representation comprises an image for a known good electrical circuit of the same type as the electrical circuit.

51. The method claimed in claim 47, wherein the spatial characteristic is a separation between the at least two portions in the representation.

52. The method claimed in claim 47, wherein the at least two portions are features and the at least one spatial characteristic comprises a spatial location of the features in the electrical circuit.

53. The method claimed in claim 47, wherein the first inspection operation and the second inspection operation are merged with the representation to form an inspection reference.

54. The method claimed in claim 47, wherein the spatial characteristic at least partially includes a shape of a portion.

55. A system for inspecting electrical circuits, comprising:

an inspection reference generator configured to:

receive a representation of an electrical circuit to be inspected, prior to inspecting the electrical circuit, and to analyze the representation to classify at least two portions of the representation according to at least one spatial characteristic; and assign a first inspection operation to a first portion having a first classification and assign a second inspection operation to a second portion having a second classification, the first and second inspection operation each comprising a different tolerance;

an electrical circuit inspector operative to acquire a representation of an electrical circuit being inspected; and a defect detector configured to detect defects in said electrical circuit being inspecting by using said first inspection operation for inspecting a portion in the electrical circuit being inspected corresponding to said first portion, and using said second inspection operation for inspecting a portion in the electrical circuit being inspected corresponding to said second portion.

56. The method claimed in claim 55, wherein the representation comprises CAM data for the electrical circuit.

57. The method claimed in claim 55, wherein the representation comprises CAD data for the electrical circuit.

58. The method claimed in claim 55, and wherein the representation comprises an image for a known good electrical circuit of the same type as the electrical circuit.

59. The method claimed in claim 55, wherein the spatial characteristic is a separation between the at least two portions in the representation.

60. The method claimed in claim 55, wherein the at least two portions are features and the at least one spatial characteristic comprises a spatial location of the features in the electrical circuit.

61. The method claimed in claim 55, wherein the first inspection routine and the second inspection routine are merged with the representation to form an inspection reference.

62. The method claimed in claim 55, wherein the spatial characteristic at least partially includes a shape of a portion.

* * * * *